United States Patent [19]

Park et al.

[11] 4,339,671

[45] Jul. 13, 1982

[54] PROPORTIONAL BASE DRIVE CIRCUIT

[75] Inventors: John N. Park, Rexford; Robert L. Steigerwald, Scotia, both of N.Y.

[73] Assignee: General Electric Company, Schenectady, N.Y.

[21] Appl. No.: 133,489

[22] Filed: Mar. 21, 1980

[51] Int. Cl.³ .................................... H03K 17/60
[52] U.S. Cl. ............................ 307/253; 307/275; 307/314
[58] Field of Search ............... 307/275, 253, 314

[56] References Cited

U.S. PATENT DOCUMENTS

| | | | |
|---|---|---|---|
| 2,999,172 | 9/1961 | Lawrence | 307/275 |
| 3,313,954 | 4/1967 | Walker | 307/275 |
| 3,610,963 | 10/1971 | Higgins | 307/275 |

*Primary Examiner*—Harold A. Dixon
*Attorney, Agent, or Firm*—William H. Steinberg; James C. Davis, Jr.; Marvin Snyder

[57] ABSTRACT

An improved proportional base drive circuit for rapidly and efficiently switching a high current bipolar load transistor comprises a transformer having first and second serially coupled primary windings, and first and second secondary windings coupled to the collector and to the base, respectively, of a high current load transistor for supplying the transistor with collector current and base current proportional to the collector current, respectively. A diverter circuit is coupled to the second secondary transformer winding and to the base and emitter of the load transistor. During intervals when the second transformer primary winding is effectively short circuited to initiate load transistor turn-off, the diverter circuit diverts current in the second secondary winding away from the load transistor base and also removes load transistor stored charge to effect rapid load transistor turn-off, thereby assuring reliable transistor switching.

7 Claims, 2 Drawing Figures

PROPORTIONAL BASE DRIVE CIRCUIT

BACKGROUND OF THE INVENTION

This invention relates generally to transistor base drive circuits and more specifically to a transistor base drive circuit for rapidly and efficiently switching a high current bipolar load transistor.

The advent of high current transistors capable of switching hundreds of amperes at high voltages has led to the development of improved switching mode power conditioners such as inverters, battery chargers, chopper circuits and the like. By fabricating switching mode power conditioners of such high current transistors in place of conventional four layer or pnpn semiconductor switching devices such as thyristors, switching mode power conditioner efficiency can be improved and power conditioner cost and size can be reduced.

To obtain good switching mode power conditioner performance, it is necessary that each power conditioner transistor turn-on or turn-off quickly, that is to say, that each transistor be rendered rapidly conductive and nonconductive, respectively. This requires that the transistor base drive circuit closely regulate transistor base drive current. Ideally, a base drive circuit should supply the transistor with a large, fast rising pulse of base current to rapidly render the transistor conductive. Once the transistor is rendered conductive and becomes saturated, sufficient but not excessive base drive current should be supplied to maintain transistor saturation thus necessitating that the transistor base drive circuit supply the transistor with base drive current proportional to transistor collector current. To effect rapid substantial nonconductivity of the transistor once transistor turn-off has been initiated, the base drive circuit should reverse bias the transistor base with respect to the transistor emitter.

Heretofore, various base drive circuits have been proposed to effect rapid transistor switching. A common prior-art proportional base drive circuit comprises a transformer having a primary winding and first and second secondary windings. Typically, the first secondary winding of the transformer is coupled across the base-emitter junction of a bipolar load transistor and the second secondary winding is coupled in series with either the collector or the emitter of the load transistor. Initially, with the primary of the transformer energized such that the rate change of flux in the primary is zero, no current is induced in either secondary winding, and thus the load transistor remains nonconductive. When the primary winding is de-energized, causing a change in magnetic flux, current is induced in the first secondary winding, causing the load transistor to become conductive and current to pass through the second secondary winding of the transformer. The current in the second secondary winding causes an opposite polarity current to be induced in the first secondary transformer winding, thus causing transformer base current to be proportional to transistor load current, that is, the current through the collector-to-emitter portion of the transistor. When the transformer primary winding is re-energized, a current opposite in direction to load transistor base drive current is induced in the first secondary transformer winding, causing load transistor base drive current to decrease to zero, thereby rendering the transistor nonconductive.

While such prior art base drive circuits maintain transistor saturation, once the transistor saturation is reached, by supplying the transistor with base drive current proportional to transistor load current, such prior art base drive circuits do not achieve rapid load transistor turn-off. This is because, after the transformer secondary winding is de-energized, the transformer secondary winding maintains decreasing conduction of load transistor base current, causing the load transistor to briefly remain conductive even after de-energization of the transformer primary.

In contrast, the present invention concerns an improved proportional base drive circuit for rapidly switching a high current bipolar load transistor.

BRIEF SUMMARY OF THE INVENTION

It is an object of the present invention to provide a base drive circuit for rapidly switching a high current bipolar load transistor.

It is a further object of the present invention to provide a base drive circuit for rapidly switching a high current bipolar load transistor notwithstanding load transistor conduction duration.

It is yet another object of the present invention to provide a base drive circuit which supplies a high current bipolar load transistor with base drive current proportional to transistor collector current.

Briefly, in accordance with the preferred embodiment of the invention, an improved base drive circuit for rapidly and efficiently switching a high current bipolar load transistor comprises a transformer having at least one primary winding and first and second secondary windings. The transformer first secondary winding is coupled in series with the collector-to-emitter portion of a load transistor between a load and a power supply. The second secondary winding of the transformer is coupled across the load transistor base-emitter junction and supplies the load transistor with base drive current proportional in magnitude to transistor load current, that is, the current through the load transistor collector-emitter portion. Circuit means are coupled to the primary winding of the transformer for de-energizing the transformer primary winding during intervals when the bipolar switching transistor is to be conductive and for energizing the transformer primary winding during intervals other than when the bipolar switching transistor is to be conductive. An energy storage device, typically a capacitor, is coupled to the second secondary winding and to the load transistor emitter and stores energy during intervals when the load transistor is conductive. During intervals when the transformer primary is energized to effectuate load transistor turn-off, energy from the energy storage device is supplied to a diverter circuit coupled to the second secondary winding and to the base and emitter of the load transistor. The diverter circuit, when supplied with energy from the energy storage device, diverts residual current in the second secondary winding and removes load transistor stored charge to rapidly render the load transistor substantially nonconductive.

It may be desirable, in applications where the load transistor remains only briefly conductive once turned-on, to add a saturating transformer to the base drive circuit to supply the energy storage means with a large, fast rising current pulse when the load transistor initially turns on. Supplying the energy storage means with a large current pulse causes the energy storage means to charge quickly, assuring sufficient stored energy to power the diverter circuit regardless of the duration of load transistor conduction.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENT

Figure 1:
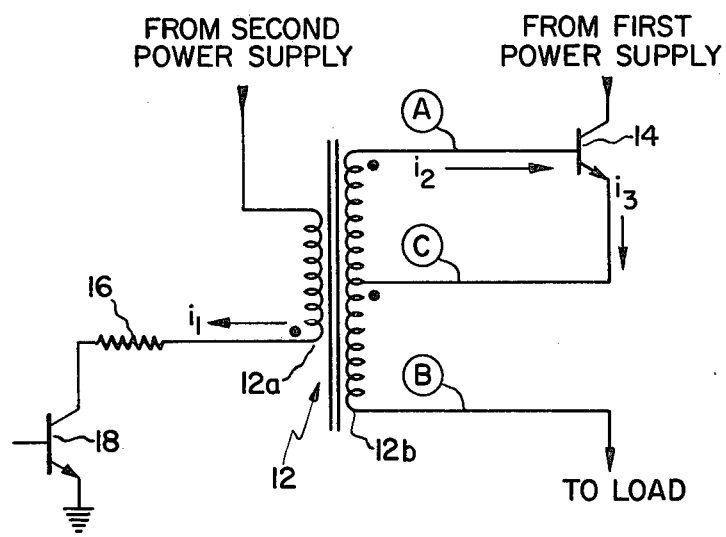
FIG. 1 is a schematic representation of a prior art proportional base drive circuit.

FIG. 1 illustrates a proportional base drive circuit 10 according to the prior art. Base drive circuit 10 comprises a transformer 12 having a primary winding 12a and a tapped secondary winding 12b, the secondary winding terminals being designated as A, B and C with terminal C being the top terminal. Windings 12a and 12b are coupled with magnetic polarity as shown by the dots next to each winding. A high current bipolar load transistor 14, typically an npn type transistor having a base, collector and emitter, is coupled at the base and emitter to secondary winding 12b terminals A and C, respectively. The collector of transistor 14 is coupled to a first power supply (not shown). The secondary winding terminal B is coupled to a load (not shown) so that during intervals when transistor 14 is rendered conductive, current is supplied from the first power supply to the load. Transformer primary winding 12a is coupled between a second power supply (not shown) and the first terminal of a resistance 16. The second terminal of resistance 16 is coupled to the collector of a switching transistor 18. The emitter of transistor 18 is connected to ground.

Initially, if transistor 18 is conductive such that the rate change of flux in primary winding is zero, then no current is induced in either portion of transformer secondary winding 12b and transistor 14 thus remains nonconductive. When transistor 18 is rendered nonconductive, a change of flux occurs in the primary winding, thereby causing a current $i_2$ of polarity designated by the associated arrow, to be induced in the first portion of transformer secondary winding 12b. The presence of current is in the first portion of secondary winding 12b causes transistor 14 to become conductive, thereby causing transistor emitter current $i_3$ to pass through the second portion of the transformer secondary winding. The presence of current $i_3$ in the second portion of secondary winding 12b causes a current of opposite polarity to be induced in the first portion of the transformer secondary. This induced current adds algebraically with current $i_2$, causing the transistor 14 base drive current to vary proportionately to transistor 14 load current. Re-energizing primary winding 12a by rendering transistor 18 conductive causes a current to be induced in the first portion of transformer secondary winding 12b opposite in polarity to that of the transistor base drive current. Eventually, the current induced in the first portion of transformer secondary winding 12b causes the transistor base drive current to decrease to zero or even reverse polarity, thereby causing transistor 14 to become nonconductive.

Although base drive circuit 10 is simple in circuitry and maintains transistor base current proportional to transistor collector current, it does not accomplish rapid turn-off of the load transistor because of the finite time required for reverse current, that is the current of opposite polarity to the transistor base drive current, to build up in the first portion of transformer secondary winding 12b after transistor 18 becomes conductive.

Figure 2:
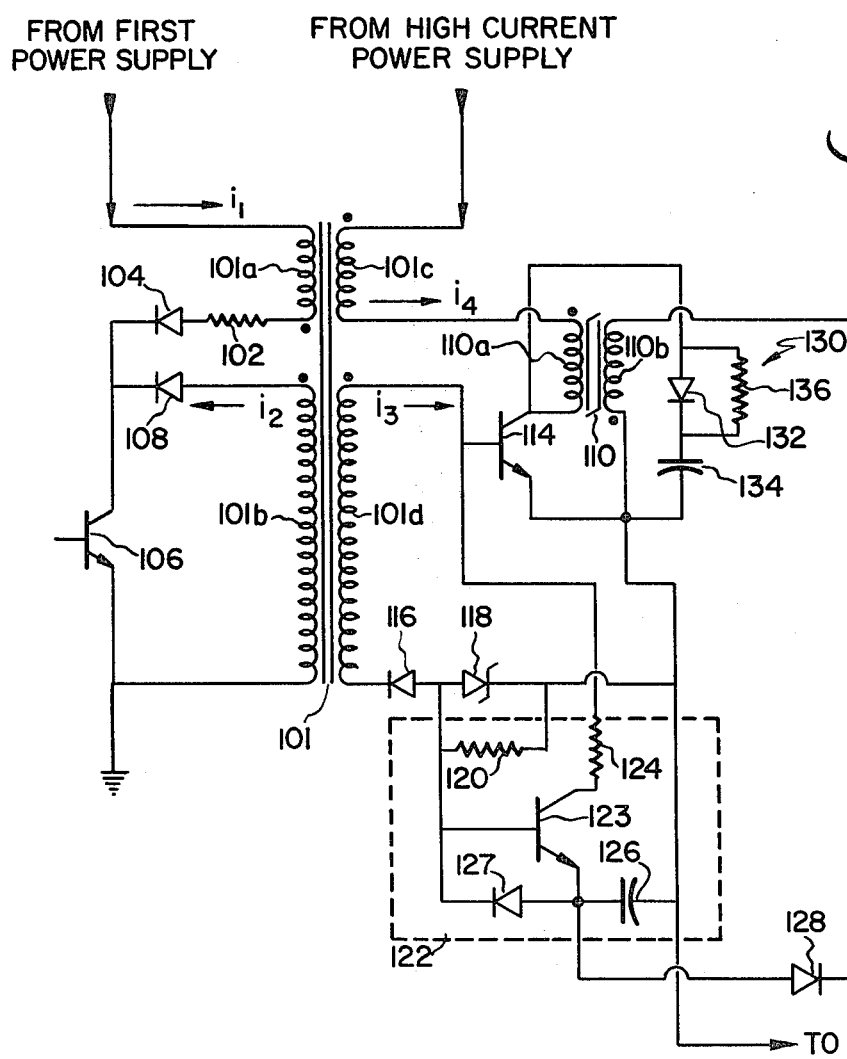
FIG. 2 is a schematic diagram of an improved proportional base drive circuit according to the present invention.

Referring now to FIG. 2, an improved proportional base drive circuit 100 for rapidly and efficiently switching a high current bipolar load transistor comprises a transformer 101 having a pair of transformer primary windings 101a and 101b, respectively, and a pair of transformer secondary windings 101c and 101d, all magnetically coupled to each other with polarities as indicated by the dot next to each winding, respectively. Transformer primary winding 101a is coupled between a first power supply (not shown) and the first terminal of a resistance 102. The second terminal of resistance 102 is connected to the anode of a first diode 104. A switching transistor 106, typically an npn transistor, having a base, collector, and emitter, is coupled at the collector to the cathode of diode 104 and at the emitter to circuit ground. The collector-to-emitter portion of transistor 106 is coupled across the serial combination of transformer primary winding 101b and a second diode 108. As will become better understood by reference to the operation of base drive circuit 100, transistor 106 controls current $i_1$ in transformer primary winding 101a and current $i_2$ in transformer primary winding 101b.

Secondary winding 101c of transformer 101 is coupled to a high current power supply (not shown) and carries a current $i_4$, which is supplied through the primary 110a of a transformer 110 to the collector of a load transistor 114. Transistor 114 is coupled at its base to the first terminal of transformer secondary winding 101d, and is coupled at its emitter to the remaining terminal of transformer secondary winding 101d through the series-opposing combination of diode 116 and zener diode 118, the zener diode being shunted by a resistance 120. The emitter of transistor 114 is also coupled to a load (not shown). With transistor 114 coupled at the collector to transformer secondary winding 101c, and coupled at the transistor emitter to transformer secondary winding 101d, it can be easily understood that during intervals of transistor 114 conduction, transistor 114 collector current is proportional to its base current because transformer windings 101c and 101d are magnetically coupled. This causes current $i_3$ in winding 101d to be proportional to current $i_4$ in winding 101c.

To accomplish rapid switching of transistor 114, base drive circuit 100 includes a diverter circuit 122, coupled to the base and emitter of transistor 114, for reverse biasing the transistor base with respect to its emitter once transistor turn-off is initiated to rapidly render transistor 114 nonconductive. Diverter circuit 122 comprises a switching transistor 123, typically an npn type transistor, which is coupled at its collector through a resistance 124 to the base of transistor 114. Transistor 123 is coupled at the emitter through a capacitance 126 to the emitter of transistor 114. The base of transistor 123 is coupled to the junction of diode 116, zener diode 118 and resistance 120.

Transistor 123, when rendered conductive, serves two important functions. First, it diverts current from transformer winding 101d through resistor 124 and away from the base of transistor 114. Secondly, it effectively couples capacitance 126 across the base emitter junction of transistor 114. Capacitance 126, is charged through a diode 127, coupled between the capacitance and the base of transistor 123, during intervals of transistor 114 conduction such that the right hand most plate of capacitor 126 is more positive than the left hand plate, and capacitor 126 will, when effectively coupled across base emitter junction of transistor 114 by transistor 123, reverse bias the base-emitter junction of transistor 114. As a consequence of the base-emitter junction of the transistor 114 being reverse biased, charge stored in the base of transistor 114, as a consequence of excess minority carrier storage during transistor 114 conduction, is removed, causing rapid transistor 114 turn-off.

A diode 128 couples the junction of diode 127 and capacitance 126 to the first terminal of the secondary winding 110b of transformer 110 which typically has a saturating core. The second terminal of secondary winding 110b is coupled to the emitter of transistor 114. Although not necessary to the operation of base drive circuit 100, transformer 110 and diode 128 supply capacitor 126 with a large pulse of current during conduction of transistor 114, thereby permitting very rapid charging of capacitance 126. This assures sufficient charge on the capacitor to reverse bias transistor 114 when the duration of transistor 114 conduction is insufficient to permit charging of the capacitance through diode 127. The core of transformer 110 is moreover designed to saturate relatively soon after transistor 114 becomes conductive, and thus the high peak of current in the capacitor is present only for a short time regardless of how long transistor 114 remains conductive.

A snubber circuit 130, comprised of a diode 132 coupled in series with a capacitance 134, and a resistance 136 shunting diode 132, is coupled between the emitter and collector of transistor 114. Snubber circuit 130, although not critical to the operation of the base drive circuit, prevents large, fast rising voltages across the collector-to-emitter portion of transistor 114 by providing a parallel path for current $i_4$ through diode 132 and capacitor 134.

The base drive circuit of the present invention operates as follows: Initially, with transistor 106 conductive, a small current $i_1$ is present in primary winding 101a while virtually no current is present in primary winding 101b. Because of the magnetic coupling between windings 101b and 101d, when transistor 106 is conductive, effectively short circuiting winding 101b, this short circuit appears across winding 101d. With transistor 114 secondary winding 101d effectively short circuited, little if any current is induced therein and hence, transistor 114 remains nonconductive. If, however, transistor 106 is rendered substantially nonconductive, then the energy stored in transformer 101 causes a current to flow out of the dotted end of winding 101d. This current causes transistor 114 to be forward biased and thus conductive.

Once transistor 114 becomes conductive, the load current $i_4$ in secondary winding 101c passes through the primary of transformer 110 to collector of transistor 114. Transformer secondary winding 101c current $i_4$ causes a current, proportional to the ratio of number of turns of winding 101c to the number of turns of winding 101d, to be induced in transformer secondary winding 101d which adds to the current induced in the winding as a consequence of current $i_1$ in transformer primary winding 101a. Thus, as current $i_4$ varies, the current in secondary winding 101d, designated as $i_3$ varies proportionately with current $i_4$, causing transistor 114 base current to vary proportionately with transistor load current, thereby assuring sufficient but not excessive base current to maintain transistor saturation.

Once transistor 114 is conductive, transistor base drive current together with current induced in the secondary 110b of transformer 110, is present in capacitor 126. This causes the capacitor to charge, resulting in the right hand most plate becoming more positive than the left hand most plate. When the charge on capacitor 126 reaches the avalanche voltage of Zener diode 118 less the voltage drop across diode 127 as may be the case for long periods of transistor 114 conduction, then Zener diode 118 becomes conductive, causing the voltage across capacitor 126 to remain at the Zener avalanche voltage less the drop across diode 127.

Transistor 114 turn-off is initiated when transistor 106 is rendered conductive to effectively short circuit primary winding 101b. When winding 101b is effectively short-circuited due to the conductivity of transistor 106, the voltage across transformer secondary winding 101d quickly drops and current through diode 116 decreases. Once diode 116 ceases to be conductive, capacitor 126 supplies base drive current to transistor 123 to render that transistor conductive. With transistor 123 conductive, the small decreasing current in winding 101d is diverted away from the base of transistor 114. More importantly, with transistor 123 conductive, capacitor 126 is effectively coupled across the emitter-base junction of transistor 114 to remove stored charge in the base of transistor 114 and reverse bias the base of transistor 114 with respect to the transistor emitter, thereby causing rapid nonconductivity of transistor 114. As a further consequence of transistor 114 being reverse-biased by capacitor 126, transistor 114 turn-on due to random voltage transients across the transformer windings is prevented.

In applications where transistor 114 may be required to remain conductive for relatively long periods of time, it may be desirable to configure transformer 110 with an additional winding (not shown) in which a short pulse current is applied to reset the transformer core. Alternatively, resetting of the transformer core may be accomplished during the periods in which transistor 114 is not conductive by the use of a permanent magnet.

The foregoing describes a base drive circuit for a high current bipolar load transistor for rapidly and efficiently switching the transistor and for supplying the transistor with base drive current proportional to collector current during intervals of transistor conduction. The base drive circuit reverse biases the load transistor at turn-off to insure rapid transistor nonconductivity and to prevent load transistor turn-on due to transient voltage.

While only certain preferred features of the invention have been shown by way of illustration, many modifications and changes will occur to those skilled in the art. It is therefore, to be understood that the appended claims are intended to cover all such modifications and changes as fall within the true spirit of the invention.

What is claimed is:

1. A proportional base drive circuit supplied by a signal level power supply to effect rapid and efficient switching of current through a load transistor supplied from a power source and coupled to a load comprising:

a main transformer having four mutually coupled windings, the load transistor having its base to emitter junction coupled across the first winding and the collector to emitter portion of the load transistor in series with the second winding, the power source and the load forming a loop, said second winding providing base current in the load transistor proportional to the load current by current transformer action between the first and second winding; the third winding connected in series with the signal level power supply;

means for alternately interrupting current flow supplied by said signal level power supply through the third winding of said transformer and shorting the fourth winding of said transformer, to cause said load transistor to be biased into conduction when said current flow supplied by said signal level power supply through said third winding is interrupted inducing a current by transformer action in said first winding and out of conduction when said fourth winding is shorted by reducing the voltage across the first winding by voltage transformer action,; and means for both driving reverse base current through the load transistor and maintaining a negative base-emitter voltage across said load transistor after turn off, when said fourth winding is shorted resulting in the voltage across the first winding being reduced including an energy storage means, a second transistor and means for biasing said second transistor into conduction when the voltage across said first winding is reduced, said second transistor connected in series with said energy device, the series combination connected across the base emitter portion of said load transistor, said energy storage means connected to said second winding to receive energy when said load transistor is conducting and said second transistor being biased into conduction when said fourth winding is shorted resulting in the voltage across said first winding being reduced, allowing stored energy in said energy storage device to force reverse base current through the load transistor to remove charge turning said load transistor off and said energy storage means providing a negative voltage.

2. The circuit of claim 1 wherein said means for alternately interrupting comprises a third transistor connected in series with said third winding and in parallel with said fourth winding.

3. The circuit of claim 1 wherein said means for driving reverse base current further comprises means for providing a pulse of current to the energy storage means when the load transistor is biased into conduction.

4. The circuit of claim 3 wherein said means for providing a pulse of current to the energy storage means comprises:

a diode; and a toroidal core transformer having a primary and a secondary winding, said transformer sized to quickly saturate after delivering the pulse, said primary winding connected in series between said second winding and the collector of said load transistor, said secondary winding connected in series with said diode, the series combination connected across said energy storage means.

5. The circuit of claim 1 wherein said means for driving reverse base current further comprises:

means for clamping the amount of energy stored in said energy storage means to a predetermined value.

6. The circuit of claim 5 wherein said energy storage means comprises a capacitor.

7. The circuit of claim 6 wherein said means for clamping comprises a Zener diode connected across said capacitor.

* * * * *